United States Patent
Courts et al.

(10) Patent No.: US 9,555,979 B2
(45) Date of Patent: Jan. 31, 2017

(54) DEVICE AND METHOD FOR TRANSFERRING ELECTRONIC COMPONENTS FROM A FIRST CARRIER TO A SECOND CARRIER

(75) Inventors: Thomas Courts, Neuried (DE); Sigmund Niklas, Zell (DE); Gerhard Schiller, Roding (DE); Markus Dogariu, Regensburg (DE)

(73) Assignee: Muehlbauer GmbH & Co. KG, Roding (DE)

( * ) Notice: Subject to any disclaimer, the term of this patent is extended or adjusted under 35 U.S.C. 154(b) by 212 days.

(21) Appl. No.: 14/112,026

(22) PCT Filed: Apr. 12, 2012

(86) PCT No.: PCT/EP2012/001598
§ 371 (c)(1),
(2), (4) Date: Dec. 18, 2013

(87) PCT Pub. No.: WO2012/139766
PCT Pub. Date: Oct. 18, 2012

(65) Prior Publication Data
US 2014/0291119 A1    Oct. 2, 2014

(30) Foreign Application Priority Data
Apr. 15, 2011   (DE) .......... 10 2011 017 218

(51) Int. Cl.
*B32B 38/10* (2006.01)
*B65G 47/53* (2006.01)
(Continued)

(52) U.S. Cl.
CPC ......... *B65G 47/53* (2013.01); *H01L 21/67132* (2013.01); *B32B 38/10* (2013.01);
(Continued)

(58) Field of Classification Search
CPC .. B32B 43/006; B32B 38/10; Y10T 156/1132; Y10T 156/1179; Y10T 156/1944; Y10T 156/1983
(Continued)

(56) References Cited

U.S. PATENT DOCUMENTS

| 4,667,402 A | 5/1987 | Wilde |
| 4,990,051 A | 2/1991 | Safabakhsh |

(Continued)

FOREIGN PATENT DOCUMENTS

| DE | 198 22 512 A1 | 10/1999 |
| DE | 198 40 226 A1 | 3/2000 |

(Continued)

*Primary Examiner* — Mark A Osele
*Assistant Examiner* — Nickolas Harm
(74) *Attorney, Agent, or Firm* — John A. Miller; Miller IP Group, PLC

(57) ABSTRACT

A device for transferring electronic components from a first carrier to a second carrier. A first receiving portion positions the first carrier on a support, wherein the electronic components are provided on a side of the first carrier, which faces away from the support. A second receiving portion positions the second carrier. The first receiving portion and the second receiving portion are arranged with respect to each other in such a manner that a gap separates the first carrier from the second carrier. A cap and/or the second receiving portion move from a first position into a second position to make the gap smaller. At least one slide lifts the first carrier, which is applied against the support, away from the support, and to move an electronic component provided on the first carrier, in the direction of the second carrier.

17 Claims, 4 Drawing Sheets

(51) Int. Cl.
 *H01L 21/67* (2006.01)
 *B32B 43/00* (2006.01)
(52) U.S. Cl.
 CPC ........ *B32B 43/006* (2013.01); *Y10T 156/1132* (2015.01); *Y10T 156/1179* (2015.01); *Y10T 156/1944* (2015.01); *Y10T 156/1983* (2015.01)
(58) Field of Classification Search
 USPC ................ 156/758, 765, 932, 943, 707, 716
 See application file for complete search history.

(56) References Cited

U.S. PATENT DOCUMENTS

| | | |
|---|---|---|
| 6,201,306 B1 | 3/2001 | Kurosawa |
| 8,136,231 B2 | 3/2012 | Schiller |
| 2002/0019074 A1 | 2/2002 | Nakazawa |
| 2006/0237142 A1 | 10/2006 | Park |
| 2007/0293022 A1 | 12/2007 | Ko |
| 2008/0086874 A1 | 4/2008 | Cheung |
| 2009/0242124 A1 | 10/2009 | Konno |
| 2012/0268621 A1 | 10/2012 | Kanma |

FOREIGN PATENT DOCUMENTS

| | | |
|---|---|---|
| DE | 10 2006 025 361 A1 | 12/2007 |
| EP | 0 585 781 A1 | 10/1993 |
| EP | 1 764 826 A1 | 3/2007 |
| JP | 2003-109979 A | 4/2003 |

DEVICE AND METHOD FOR TRANSFERRING ELECTRONIC COMPONENTS FROM A FIRST CARRIER TO A SECOND CARRIER

CROSS-REFERENCE TO RELATED APPLICATIONS

This application is a National Stage application of International Application No. PCT/EP2012/001598, filed Apr. 12, 2012, which claims priority to German Patent Application Serial No. DE 10 2011 017 218.1, filed Apr. 15, 2011.

BACKGROUND

A device and a method for transferring electronic components from a first carrier to a second carrier are described. There are described in particular a device and a method for separating an electronic component from the first carrier by means of an ejection unit and transferring it directly to the second carrier.

When transferring electronic components, in particular dies, and in particular when transferring isolated electronic components, there is generally the problem that they can easily be damaged and must therefore be treated with great care. In addition, electronic components are subject to continuous miniaturisation, so that the demands made in terms of accuracy when transferring electronic components are increasing continuously.

DE 103 49 847 B3 describes a positioning device and a positioning method for the transfer of electronic components. A semiconductor wafer arranged on a carrier film is thereby arranged above and parallel to a strip-like substrate. The wafer can be displaced within the wafer plane and additionally rotated about an axis of rotation perpendicular to the wafer plane by means of a wafer holder. An ejection device comprises an ejection needle which, by means of a downward movement, acts on the rear side of a die that is to be detached and detaches it from the carrier film. The die detached from the carrier film is thereby deposited at a bonding position on the strip-like substrate.

Because the die is guided only by the ejection needle after it has been ejected, there is a risk that the die will twist as it is being detached from the carrier film. In that case, the die can be placed at the bonding position only inaccurately. Twisting of the die can occur in particular when the ejection needle is not in contact with the die in the middle of the die, or when there is not a uniform adhesive bond between the die and the carrier film.

Because an inaccurately placed electronic component is generally to be regarded as a reject part and accordingly as waste, it is desirable to place the component as accurately as possible.

DE 198 40 226 A1 discloses a method for transferring electronic components from an auxiliary substrate to a strip-shaped carrier device. Further devices and methods for transferring electronic components which form the technological background to the device described herein and to the method described herein are described in documents JP 5267451 A, EP 0 565 781 B1 and DE 198 22 512 A1.

Problem

Accordingly, the problem is to position the electronic components on the second strip-shaped carrier with high accuracy and reproducibility. In addition, a high throughput rate is to be achieved, and the electronic components are to be treated gently.

Proposed Solution

In order to solve this problem, a device for transferring electronic components from a first carrier to a second carrier is proposed. At least one slide is connected to at least one slide-actuator. A cap comprises a support, a slide channel for receiving the at least one slide, and a gripping device for the first carrier. A first receiver is configured to position the first carrier on the support, the electronic components being provided on a side of the first carrier that is remote from the support. A second receiver is configured to position the second carrier. The first receiver and the second receiver are so arranged relative to one another that a gap separates the first carrier from the second carrier.

In addition, the cap and/or the second receiver is configured to be moved from a first position into a second position so that the gap between the first carrier and the second carrier becomes smaller. The at least one slide is configured to be extended by the at least one slide-actuator relative to the support, to lift the first carrier, which is resting against the support, off the support, and to move an electronic component provided on the first carrier in the direction towards the second carrier.

Moreover, the gripping device is configured to convey the first carrier to the support in order to separate the electronic component from the first carrier.

In order to solve the mentioned problem, a method for transferring an electronic component from a first carrier to a second, strip-shaped carrier is further proposed. This method comprises the steps: positioning a cap, a first carrier and a second carrier relative to one another so that at least one slide provided in a slide channel of the cap, an electronic component provided on the first carrier and a contact face provided on the second carrier are arranged along a common axis; moving the cap and/or the second carrier from a first position into a second position in order to make a gap between the first carrier and the second carrier smaller; extending the at least one slide relative to the support and in the direction towards the second carrier so that the first carrier, which is resting against a support of the cap, is lifted off the support; separating the electronic component from the first carrier, which is effected by a gripping device provided in the cap conveying the first carrier back to the support.

As a result of the combination of the cap, the slide and the first carrier, the electronic component can be guided securely over a longer distance. The holding forces of the first carrier thereby prevent the electronic component from twisting. As a result of the combination of the gripping device and the slide, the electronic component to be transferred can reliably be separated from the first carrier. Accordingly, the electronic component can be placed on the second carrier with greater accuracy.

Because the electronic component is separated from the first carrier not only by the movement of the slide but also by the conveying movement of the gripping device, the mechanical stress acting on the electronic component is also reduced.

In this device, the gap between the first carrier and the second carrier is made smaller before the electronic component is transferred. As a result, the movement of the at least one slide and the stretching of the first carrier can be reduced to a minimum. The risk of the first carrier being damaged as it is lifted off the support can accordingly be reduced.

Form and Properties of the Device and of the Method

The at least one slide and the cap can be connected independently of one another to a positioning device provided for positioning the cap. Accordingly, the at least one slide can be moved independently of the cap, at least in the direction towards the second carrier. Alternatively, the at least one slide and the at least one slide-actuator can also be fastened directly to the cap.

A control unit can be provided for controlling the device. The control unit can terminate the extension movement of the slide as soon as the control unit detects that the electronic component is in contact with the second carrier or with an adhesive applied to the second carrier. The control unit is also able to detect whether the electronic component displaces the adhesive partly or completely and is in contact with the second carrier. The second carrier can have contact faces which are to be contacted directly. When the electronic component is resting on the second carrier, before the gripping device conveys the first carrier to the support, the electronic component is guided by the holding forces of the first carrier during the entire movement from the first carrier to the second carrier. Twisting of the electronic component can effectively be prevented in this manner.

At least one sensor element can be connected to the control unit. The at least one sensor element can transmit sensor data to the control device, on the basis of which the control unit detects contact of the electronic component with the second carrier or with an adhesive applied thereto. The at least one sensor element can be in the form of a measuring element which detects the power consumed by the at least one slide-actuator. A measuring element which detects the distance covered by the at least one slide can further be provided. By a combined evaluation of the power consumed and the distance covered, the control system is thereby able to detect that the electronic component is located on the second carrier with greater reliability than would be possible in the case of the isolated evaluation of one parameter.

The first carrier can be stretched by the movement of the cap from the first position into the second position. Likewise, the extension of the at least one slide can stretch the first carrier.

The at least one slide can be surrounded by the cap when it is in the retracted state. A tip of the at least one slide can be arranged substantially in the centre of the support. By arranging the tip of the at least one slide in the centre of the support, uniform stretching of the first carrier can be achieved when the cap is brought from the first position into the second position and/or when the at least one slide is extended.

The gripping device can be a vacuum gripper, the gripping device being connected to a vacuum source. The support can additionally have depressions. The depressions can be, for example, channel-shaped, groove-shaped, cone-shaped and/or hemispherical. The depressions can be provided so that a vacuum can be built up between the first carrier and the support. The vacuum can cause the ambient pressure to press the first carrier against the support. The depressions can be connected to a vacuum chamber.

The gripping device can be in such a form that the build up of the vacuum in a central region of the support takes place in a delayed manner. For example, the vacuum can first be built up at depressions arranged at the edge of the support. This can have the effect that the electronic component to be transferred first becomes detached from the first carrier at the edge of the component.

For example, the vacuum chamber can have a shape that delays the build up of the vacuum in a central region of the support. Alternatively or in addition, it can be provided that leakage air drawn in via the slide channel delays the build up of the vacuum in the central region of the support.

An illuminating device and a camera device can further be provided. These can be fastened to the housing of the cap or to a positioning device provided for positioning the cap relative to the first and second receivers The camera device can acquire image data, which can be converted into correction values by the control unit. The correction values can then be used for positioning the cap and/or the first receiver.

A heating element can be provided in a central region of the support. The heating element can be a light conductor, through which laser radiation or the radiation of one or more infra-red light-emitting diodes is guided to the first carrier. The laser radiation or the infra-red radiation can heat the first carrier and thus reduce the holding forces between the first carrier and the electronic component. Likewise, the heating element can also be provided at a distance from the cap and transmit heat energy to the first carrier in a contact-free manner, for example by means of infra-red radiation. Alternatively or in addition, an electric heating element can also be provided in the vicinity of the cap or of the support. For example, the heating element can be attached to the positioning device.

The slide-actuators can be piezo actuators, for example.

The cap can be moved from the first position into the second position by a cap-actuator. The cap-actuator can be a piezo actuator, for example.

Cap-positioning actuators can be provided for positioning the cap relative to the first support and to the second support. The cap-positioning actuators can be provided for vertical and/or horizontal positioning of the cap. The cap-positioning actuators can be provided on the positioning device for the cap. The cap-positioning actuators can be piezo actuators, for example. Cap-displacing actuators can additionally be provided. The cap-displacing actuators can be provided on the positioning device for the cap.

The first receiver and/or the second receiver can likewise have positioning actuators. By means of the receiver-positioning actuators, the first receiver and the second receiver can be positioned relative to the cap and/or to the other receiver. Receiver-positioning actuators can be provided for vertical and horizontal positioning of the first and/or second receiver. A receiver-positioning actuator can be provided for rotating the first receiver about a vertical axis. The receiver-positioning actuators can be piezo actuators. The first and/or second receiver can further have displacing actuators.

Where two or more slides are provided, the cap can be so positioned relative to the first carrier and to the electronic component to be transferred that an imaginary central longitudinal axis of all the slides, the electronic component to be transferred and the contact face are arranged along a common axis.

The first carrier can already be resting against the support during the positioning of the cap relative to the first carrier or the positioning of the first carrier relative to the cap. The first carrier can further rest against the support at least after positioning of the cap relative to the first carrier or positioning of the first carrier relative to the cap.

During the positioning of the cap, of the first carrier and of the second carrier, a camera device can acquire image data and transmit them to a control unit. The control unit can then convert the image data into correction values. The horizontal and/or vertical position of the cap, of the first carrier or of the second carrier can then be corrected on the basis of the correction values. The correction can take place when the cap is in the first position and/or the first carrier is resting against the support.

In addition or alternatively, a distance-measuring element can be provided for the vertical positioning of the cap, of the first carrier and/or of the second carrier. The distance-measuring element can transmit position data of the cap, of the first carrier and/or of the second carrier to the control unit, which converts the data into correction values.

The at least one slide can be extended relative to the support and in the direction towards the second carrier. This extension movement can be terminated by the control unit as soon as the control unit detects that the electronic component to be transferred is in contact with the second carrier. If adhesive is provided on the second carrier, the control system can additionally detect that the electronic component is in contact with and/or displaces the adhesive. Accordingly, the electronic component to be transferred can be guided by the holding forces between the first carrier and the electronic component to be transferred throughout the entire movement from the first carrier to the second carrier. Furthermore, the electronic component can be pressed in a defined manner onto the second carrier or an adhesive provided thereon. A portion of the adhesive can thereby be displaced by the electronic component. A reliable connection between the electronic component to be transferred and the second carrier can thus be obtained. The adhesive provided on the second carrier can be provided in the form of a drop of adhesive on the contact face of the second carrier.

After separation of the electronic component from the first carrier, the cap can be moved from the second position into the first position. While the cap is being moved from the second position into the first position, the at least one slide can continue to be in contact with the component resting on the second carrier. For example, the at least one slide can remain extended. Because the electronic component can thus continue to be pressed onto the second carrier while the gap between the first carrier and the second carrier is becoming larger, it can be ensured that the first carrier has separated completely from the electronic component to be transferred.

The movement of the cap back into the first position additionally enables a collision between the electronic component transferred to the second carrier and the electronic components on the first carrier to be prevented. In particular, collision of electronic components with one another can be ruled out for a subsequent positioning which is provided before a further electronic component is transferred. Contact of the electronic components provided on the first carrier with the adhesive provided on the second carrier can likewise be ruled out.

During the movement of the cap from the second position into the first position, the gripping device can continue to convey the first carrier already resting against the support to the support. For example, the vacuum produced between the first carrier and the support can be maintained until the cap has reached the first position.

The at least one slide can be retracted once the cap has reached the first position. A time offset can likewise be provided between the beginning of the movement of the cap and the beginning of the retraction movement of the at least one slide.

The displacement distance of the at least one slide can be less than +/−8 mm. For example, the displacement distance of the at least one slide can be +/−4 mm. The distance between the first position and the second position of the cap can be approximately half the displacement distance of the at least one slide. The at least one slide can be extended continuously or in two steps.

The gripping device can convey the first carrier to the support by means of a vacuum. The gripping device can first build up the vacuum at the outside edge of the support. Accordingly, the first carrier can be drawn in at the outside edge of the support first. The first carrier can thus be detached first at the edge of the electronic component to be transferred.

In order to control the movement of the at least one slide, the power consumed by the slide-actuator(s) can be detected. Likewise, in order to control the movement of the at least one slide, the distance covered by the slide(s) can be detected. The movement of the at least one slide can be terminated as soon as the control unit detects that the power consumed and/or the distance covered exceeds a threshold value. The control unit can further use the ratio between the power consumed and the distance covered to control the movement of the at least one slide.

BRIEF DESCRIPTION OF THE DRAWINGS

Further objects, features, advantages and possible uses of the device disclosed herein and of the method disclosed herein will become apparent from the following description of exemplary embodiments, which are not to be interpreted as limiting, and the accompanying drawings.

DETAILED DESCRIPTION OF EXEMPLARY EMBODIMENTS

Figure 1:
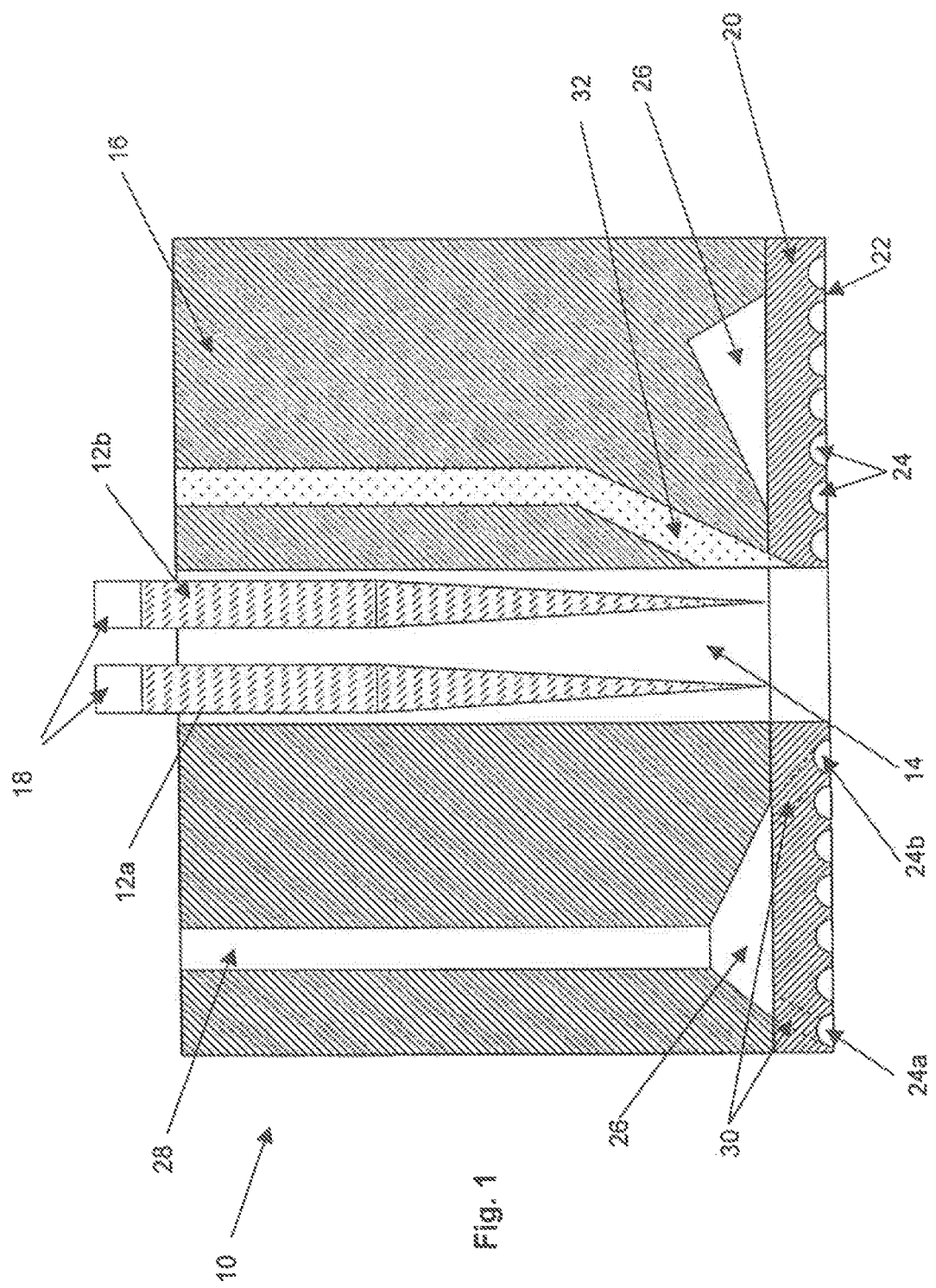
FIG. 1 shows an exemplary embodiment of a cap and of a slide provided in the slide channel of the cap.

FIG. 1 shows an exemplary embodiment of a cap 10. Two slides 12a, 12b are provided in a slide channel 14 of the cap 10. More or fewer slides can also be provided, however. The slides 12a, 12b have a tip and are approximately needle-shaped. The cap 10 comprises a housing 16, the slide channel 14 being provided approximately in the middle of the housing 16. The housing 16 shown in FIG. 1 is substantially cylinder shaped. In an exemplary embodiment, the housing 16 can have, for example, the shape of a circular cylinder or of a cuboid. The housing 16 can likewise taper or have an irregular shape.

The slides 12a, 12b are each connected to their own slide-actuator 18. It is, however, also possible for the two slides to be connected to a common slide-actuator 18. The slide-actuators 18 are not limited to a particular type of actuator. For example, piezo actuators can be used. Likewise, electromagnetic, pneumatic or hydraulic actuators, for example, can also be used.

A gripping device 20 is additionally provided on the cap 10. The gripping device 20 can be connected to the housing 16, as is shown in FIG. 1, or it can be in the form of an integral part of the housing 16. The gripping device 20 can be in the form of, for example, a vacuum gripper, a magnetic gripper or an electrostatic gripper.

FIG. 1 shows a gripping device 20 that operates by vacuum. The gripping device 20 is connected by way of a vacuum line 28 to a vacuum source (not shown), for example a vacuum pump.

In the exemplary embodiment shown in FIG. 1, a support 22 is provided at the lower end of the gripping device 20. An opening is provided as an extension of the slide channel 14 approximately in the centre of the gripping device 20 and of the support 22, which opening allows the slides 12a, 12b to be extended through the slide channel 14.

The gripping device 20 has a plurality of depressions 24 which are approximately semi-circular in cross-section and are arranged in the support. The depressions 24 can be channel-shaped, groove-shaped, cone-shaped or hemispherical, for example. It is also possible for some depressions to have a first shape and other depressions to have a different, second shape. The depressions 24 can further be connected to one another or separate from one another. The gripping device 20 can likewise be formed of an air-permeable material, for example of an air-permeable foam.

The depressions 24 of the gripping device 20 are connected to a vacuum chamber 26 by way of distribution lines 30 shown by dashed lines in FIG. 1. The vacuum chamber 26 can be in the form of a cavity in the gripping device 20, in the housing 16 or, as shown in FIG. 1, in the form of a cavity formed by the gripping device 20 and the housing 16.

In the example of the device shown here, the vacuum chamber 26 is annular and encloses the slide channel 14 partially or completely. A plurality of separate vacuum chambers can likewise be provided.

In the exemplary embodiment shown in FIG. 1, the vacuum chamber 26 is in such a form that the build up of the vacuum in a central region of the support 22 takes place in a delayed manner.

The vacuum chamber 26 shown in FIG. 1 has a substantially triangular cross-sectional area. The longest side of the triangle faces the support 22, and the smallest angle, in terms of amount, of the triangle faces the slide channel 14. The connection for the vacuum line 28 is provided at the edge of the vacuum chamber 26 that is remote from the support 22.

The delay in the build up of pressure in the central region of the support 22 occurs because leakage air is drawn in via the slide channel 14. Accordingly, substantially more air has to be drawn off in the central region of the support 22 than at the edge of the support 22. The vacuum is thus first built up at the edge of the support 22 and only then in the central region of the support 22.

In the exemplary embodiment shown in FIG. 1, a heating element is provided. The heating element comprises a light conductor 32. The light conductor 32 is so arranged that the radiation coupled out of the light conductor 32 can strike a first carrier 68 arranged in the region of the support 22 through the slide channel 14 and/or the opening in the gripping device 20. This allows the first carrier 68 purposively to be heated. A laser light source as well as one or more infra-red light-emitting diodes can be provided for coupling the radiation energy into the light conductor 32.

In an exemplary embodiment that is not shown, the heating element can be provided next to the cap 10, for example on a positioning device 11, so that there is no direct connection between the heating element and the cap 10. The heat energy can thereby be transmitted in a contact-free manner, for example by infra-red radiation.

Alternatively or in addition, it is also possible to provide an electric heating resistance, which is arranged in a central region of the support 22, of the gripping device 20 and/or of the housing 16. A heating resistance can likewise be provided on the slides 12a, 12b.

Figure 2:
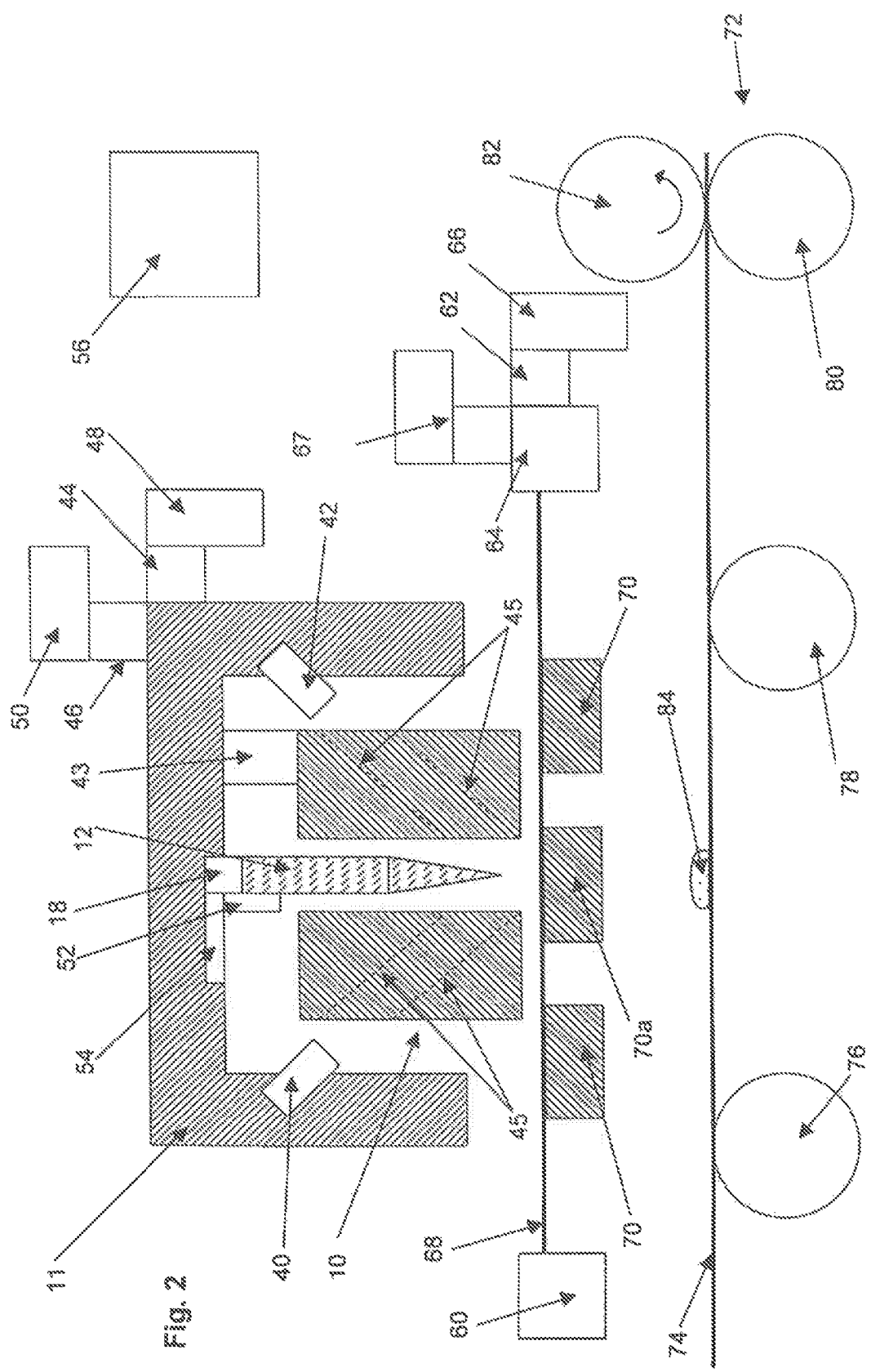
FIG. 2 shows an exemplary embodiment of a device for transferring electronic components from a first carrier to a second carrier.

FIG. 2 shows a device for transferring electronic components from a first carrier to a second carrier. The cap 10 shown in FIG. 2 can correspond to the cap 10 described in connection with FIG. 1. For reasons of clarity, however, not all the details of the cap 10 are shown in FIG. 2.

The cap 10 is attached to the positioning device 11, the positioning device 11 being provided for positioning the cap 10 relative to a first receiver 60 and a second receiver 72. The unit comprising the cap 10, the at least one slide 12 and the positioning device 11 can be referred to as an ejection unit. A cap-actuator 43 can move the cap 10 from a first position into a second position. The cap 10 can accordingly be moved relative to the positioning device 11.

In the example shown in FIG. 2, the at least one slide 12 is connected directly to the positioning device 11. The slide-actuator 18 allows the slide 12 to move relative to the positioning device 11. The cap-actuator 43 and the slide-actuator 18 can move the slide 12 and the cap 10 along a common axis. The common axis can, for example, correspond to or be parallel with the longitudinal axis of the slide 12.

An illuminating device 40 and a camera device 42 are provided on the positioning device 11. Openings or channels are provided in the housing 16 of the cap 10 so that the illuminating device 40 is able to illuminate the first carrier 68 and the camera device 42 is able to acquire image data. In FIG. 2, the openings or channels are indicated by the dashed lines 45. The openings or channels can be so arranged that the camera device 42 is able to acquire image data of an electronic component to be transferred only when the cap 10 is in the first position. Fastening the illuminating device 40 and the camera device 42 to the positioning device 11 has the advantage that the mass to be moved when the cap 10 is moved from the first position into the second position can be kept small.

As an alternative to fastening the illuminating device 40 and the camera device 42 to the positioning device 11, the illuminating device 40 and the camera device 42 can also be fastened directly to the cap 10.

In order to position the cap 10 and the at least one slide 12 relative to a first receiver 60 as well as to a second receiver 72, the positioning device 11 already mentioned is provided. The positioning device 11 comprises a first cap-positioning actuator 44, a second cap-positioning actuator 46 and a third cap-positioning actuator (not shown). At least part of the positioning device 11 as well as the cap 10 connected to the positioning device can be displaced in the vertical direction by means of the first cap-positioning actuator 44 and in the horizontal direction by means of the second and third cap-positioning actuators 46. By means of a vertical displacement, the distance between the cap 10 and the first carrier 68 can be changed. The cap-positioning actuators 44, 46 can, however, also be, for example, electromagnetic, pneumatic, hydraulic and/or piezo actuators.

In the exemplary embodiment shown in FIG. 2, cap-displacing actuators 48, 50 are additionally provided. At least part of the positioning device 11 as well as the cap 10 connected to the positioning device and the at least one slide 12 accommodated in the slide channel of the cap 10 can be moved in the vertical direction by means of a first cap-displacing actuator 48 and in the horizontal direction by means of the second and third (not shown) cap-displacing actuators 50.

If cap-positioning actuators 44, 46 and cap-displacing actuators 48, 50 are provided, the cap-displacing actuators 48, 50 can be used for approximate positioning and the cap-positioning actuators 44, 46 can be used for fine positioning. If only cap-positioning actuators 44, 46 are provided, positioning takes place in one step. If cap-displacing actuators 48, 50 are additionally provided, positioning takes place in two steps. It is thereby possible to provide one-step positioning for one direction and two-step positioning for another direction.

Sensor elements are further provided on the positioning device 11. In the exemplary embodiment shown in FIG. 2, the sensor elements are a distance-measuring element 52 and a power-measuring element 54. The distance-measuring element 52 detects the distance covered by the slide 12. The power-measuring element 54 detects the power consumed by the slide-actuator 18. Alternatively to the power-measuring element 54, a force-measuring element can also be provided between the slide 12 and the slide-actuator 18.

In the region of the support 22 there is provided the first receiver 60, which can be moved separately from the positioning device 11 and the cap 10. In the exemplary embodiment shown in FIG. 2, the first receiver 60 is arranged beneath the cap 10.

As in the case of the positioning device 11, one-step or two-step positioning can also be provided for the first receiver 60. Displacing actuators and/or positioning actuators can accordingly be provided. In the exemplary embodiment shown in FIG. 2, a first receiver-positioning actuator 62, a second receiver-positioning actuator 64, a first receiver-displacing actuator 66 and a second receiver-displacing actuator 68 are provided. The first and second receiver-positioning actuators 62, 64 and the first and second receiver-displacing actuators 66, 68 permit a horizontal movement of the first receiver 60. The movements of the first receiver 60 can take place relative to the cap 10. Actuators (not shown) that permit a rotary movement of the first carrier 68 can further be provided. Thus, for example, the first carrier 68 can be rotated about a vertical axis, so that the electronic components can be oriented exactly before they are transferred to the second carrier 74. In a special case, vertical positioning of the first receiver 60 can additionally be provided. Further actuators can accordingly be provided.

The first receiver 60 receives a first carrier 68. Electronic components 70 are provided on a side of the first carrier 68 that is remote from the support 22. In an exemplary embodiment, the first carrier 68 can be a wafer film. The wafer film can be mounted on a clamping ring. The electronic components can be isolated dies, which were applied to the wafer film before being isolated.

The second receiver 72 can receive a second carrier 74. The second receiver 72 comprises first, second and third support rollers 76, 78, 80 and a drive roller 82. The support rollers 76, 78, 80 are not limited to a roller form. Glass half-cylinders, for example, can thus also be provided.

As in the case of the positioning device 11 and the first receiver 60, one-step or two-step positioning can be provided for the second receiver 72. Displacing actuators and positioning actuators can accordingly be provided. In the exemplary embodiment shown in FIG. 2, however, only one-step horizontal positioning of the second receiver is possible. Further actuators can be provided, however, for the one- or two-step positioning of the second receiver 72 in the vertical and/or a second horizontal direction.

In an exemplary embodiment, the second carrier 74 is a substrate strip. The substrate strip can be used, for example, as carrier material in the production of chip cards or smart cards. The second carrier 74 can have a contact face on which an electronic component 70*a* to be transferred is to be placed. The contact face can have electrical contacts. However, the contact face can likewise be an electrically non-conducting structure, which facilitates positioning of the second carrier 74 or orientation of the electronic components to be transferred. Adhesive can additionally be provided on the second carrier 74 in the form of a drop of adhesive 84 on the contact face or in the form of an adhesive layer.

The device shown in FIG. 2 further has a control unit 56. The control unit is connected to the actuators 18, 43, 44, 46, 48, 50, 62, 64, 66, 67, 82, the sensor elements 52, 54, the illuminating device 40 and the camera device 42 shown in FIGS. 1 and 2. The control unit 56, on the basis of image data acquired by the camera device 42, is able to calculate correction values, which can be used for the positioning of the cap 10 and/or of the first receiver 60. In addition, the control unit can activate the actuators 18, 43, 44, 46, 48, 50, 62, 64, 66, 67, 82 directly or indirectly and thus bring each of the elements of the device shown into a desired position in the necessary chronological sequence. Moreover, the control unit can evaluate the data acquired by the measuring elements 52 and 54 and, on the basis of the data, determine whether the electronic component 70*a* to be transferred is resting on the second carrier or whether a further extension of the slide 12 is necessary.

Figure 3:
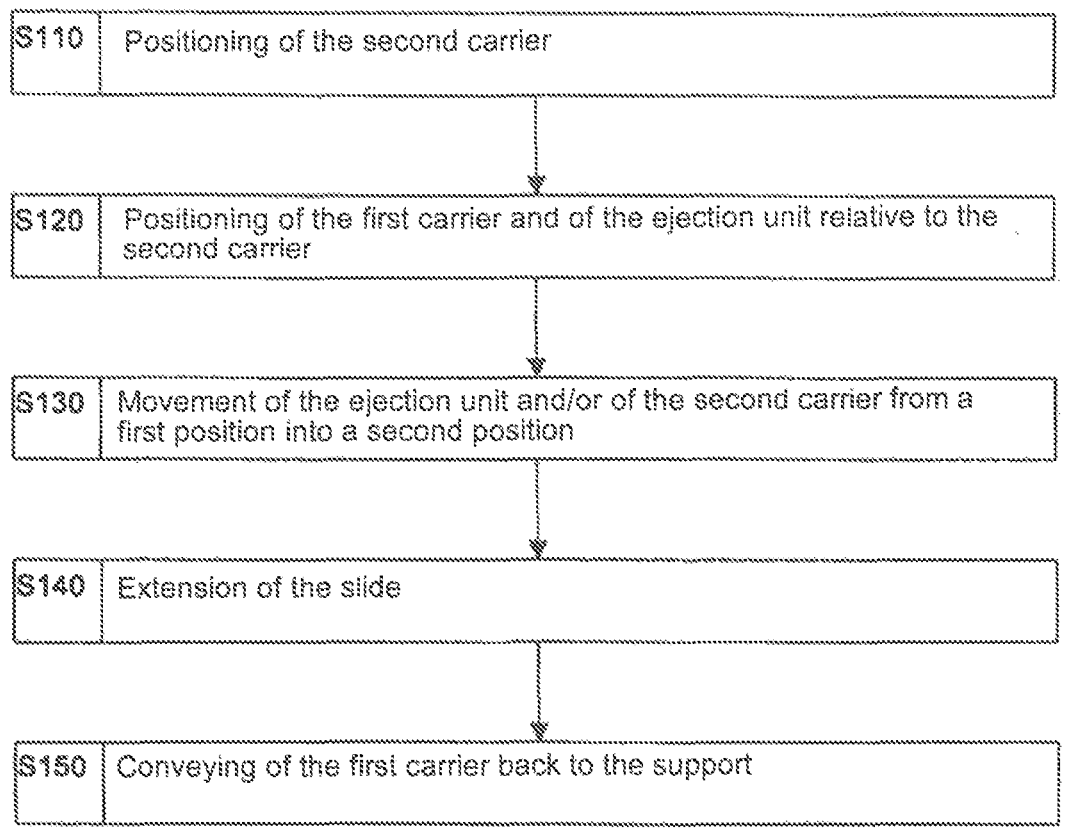
FIG. 3 shows a method for transferring electronic components from a first carrier to a second carrier.

FIG. 3 shows a method for transferring electronic components from a first carrier to a second carrier.

In step S110, the second carrier 74 is positioned. In the embodiment shown in FIG. 2, this is carried out by the control unit 56 activating the drive roller 82 so that a contact face, and optionally a drop of adhesive applied to the contact face, is arranged between the first and second support rollers 76, 78.

In step S120, the cap 10 and the first carrier 68 are positioned relative to the second carrier. To that end, the control unit 56 can evaluate the data received from the camera device 42 and activate the displacing actuators and the positioning actuators of the positioning device 11 and of the first receiver 60 accordingly, so that the at least one slide 12, an electronic component 70*a* to be transferred and the contact face are arranged along an axis. In addition, the cap 10 and the first receiver can be positioned relative to one another so that the first carrier 68 is arranged beneath the support 22. One side of the first carrier 68 can thereby rest against the support 22.

Steps S110 and S120 do not have to be performed in succession. Thus, for example, the first and second carriers and the cap 10 can also be positioned simultaneously. Likewise, the cap 10 and the first receiver 60 can be pre-positioned approximately before step 110, and the cap 10 and the first carrier 68 can then be positioned exactly after the second carrier 74 has been positioned.

In a further step S130, the cap 10 and/or the second carrier 74 is moved from a first position into a second position. Because the second carrier 74 can be moved in only a horizontal direction in the exemplary embodiment shown in FIG. 2, this step is carried out in the exemplary embodiment shown by a movement of the cap 10 in the direction towards the second carrier 74. The first receiver 60 can thereby remain in the previous position or, similarly to the cap 10, can be moved in the direction towards the carrier 74. If the first receiver 60 remains in the previous position, the first carrier 68 can be stretched by the movement of the cap 10. A gap between the first carrier 68 and the second carrier 74 is thereby made smaller.

Then, in step S140, the at least one slide 12 is extended in the direction towards the second carrier 74 so that at least the tip of the at least one slide 12 projects from the slide channel 14. The at least one slide 12 is thereby in contact with the first carrier 68 and lifts it off the support 22, so that a free space forms between the support 22 and the first carrier 68. As a result, the first carrier 68 is stretched in the region around the support 22. The at least one slide 12 can thereby pierce the first carrier 68 partly or completely. As a result of the extension movement, the electronic component 70a provided on the side of the first carrier 68 that is remote from the support 22 is moved in the direction towards the second carrier 74.

The electronic component 70a to be transferred can thereby be moved until one side of the electronic component 70a is in contact with the second carrier 74 and/or with a drop of adhesive 84 which may have been applied to the second carrier. In order to ensure a reliable connection between the second carrier 74, the drop of adhesive 84 and the transferred electronic component, the electronic component can be pressed into the drop of adhesive 84 until adhesive is displaced thereby. Contact or displacement can be detected by the control unit 56 on the basis of the data acquired by the distance-measuring element 52 and the power-measuring element 54 because, owing to the mechanical resistance of the second carrier 74, the power consumption of the slide-actuator 18 increases while the slide 12 no longer moves or moves only insignificantly. The control unit 56 accordingly monitors the distance-measuring values and power-measuring values or changes thereof.

In the following step S150, the first carrier 68 is conveyed back to the support 22 by the gripping device 20. Vacuum, for example, can be used for this purpose. The vacuum has the effect of drawing off the air that is present in the free space between the support 22 and the first carrier 68, so that the pressure in the free space between the first carrier 68 and the support 22 is lower than the pressure beneath the first carrier 68. Consequently, the first carrier 68 is pressed towards the support 22 by the ambient pressure.

Because the at least one slide 12 continues to press the electronic component 70a onto the second carrier 74, or at least holds the electronic component in a position spaced apart from the support 22, an adhesive bond between the electronic component 70a and the first carrier 68 is released.

The cap 10 can then be moved into the first position and the slide 12 can be retracted completely, and a further electronic component can be transferred by the steps described above.

FIGS. 4a-4f show a transfer operation according to an exemplary embodiment.

Figure 4A:
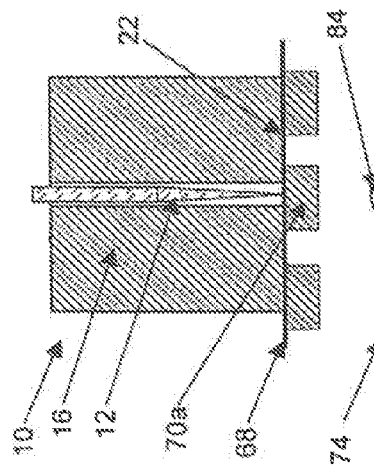
FIGS. 4a-4f show a transfer operation according to an exemplary embodiment.

As is shown in FIG. 4a, the cap 10 and the first carrier 68 are positioned above the second carrier 74, the support 22 being in contact with the first carrier 68, or the first carrier 68 being arranged at a small distance beneath the support 22. The cap 10 is in the first position. An image of the rear side of the electronic component 70a to be transferred can be taken by the camera device 42 through openings in the housing 16. The illuminating device 40 thereby illuminates the rear side of the electronic component 70a to be transferred through the first carrier 68. The image taken by the camera device 42, or the image data, is converted by the control unit 56 into correction values for the horizontal positioning of the cap 10. These correction values can optionally be used for correcting the position of the cap 10 and of the first receiver 60. After the positioning, or after the correction, the slide 12 and the electronic component 70a to be transferred are located above the contact face.

Figure 4B:
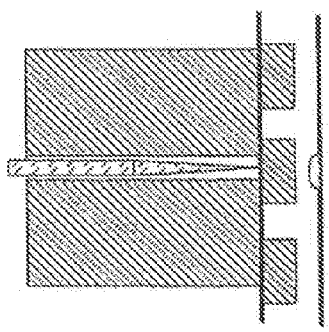

In FIG. 4b, the cap 10 is shown in the second position. The first carrier 68 has thereby been biased by the movement of the cap 10 in the direction towards the second carrier 74. The distance between the cap 10 and the second carrier 74 can be minimal. The slide 12 is still not in contact with the electronic component 70a to be transferred. However, it is also possible for the at least one slide 12 already to be resting against the first carrier 68.

Figure 4C:
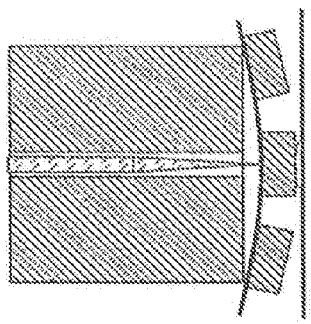

In FIG. 4c, the slide 12 is shown in an extended state. As a result of the extension movement, the slide 12 is in contact with the first carrier 68, pierces it partly or completely and, if the slide 12 pierces the first carrier completely, is in contact with the electronic component 70a to be transferred. The first carrier 68 is lifted off by the support 22 and biased. The slide 12 is extended until the electronic component 70a to be transferred is in contact with the drop of adhesive 84. Owing to the displacement of the drop of adhesive 84 and the mechanical resistance of the second carrier, the power consumption of the slide-actuator 18 increases. This is detected by the power-measuring element 54. The control unit 56 terminates the extension movement of the slide when the power consumption of the slide-actuator 18 has reached a threshold value. Detection of the power consumed by the slide-actuator 18 allows breakage of or damage to the electronic component 70a to be transferred to be prevented.

Figure 4D:
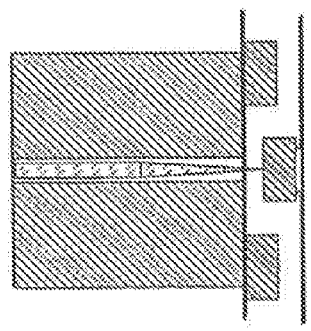

In FIG. 4d, the electronic component 70a to be transferred and the cap 10 are shown after the electronic component 70a to be transferred has been separated from the first carrier 68. The electronic component 70a to be transferred is held in position by the slide 12. In addition, the gripping device 20 is activated. In the described exemplary embodiment, a vacuum is generated to that end between the first carrier 68 and the support 22. As a result, the first carrier 68 is conveyed back to the support 22. As a result of this suction operation, the electronic component 70a to be transferred is separated from the first carrier 68. The vacuum is built up from the outside edge of the support 22 to the centre of the support 22. In order to reduce the holding forces between the electronic component 70a to be transferred and the first carrier 68, the first carrier 68 can be heated by means of a heating element before the gripping device 20 is activated. This can take place, for example, by means of the laser radiation introduced through the light conductor 32, or by permanent heating by means of radiant heaters.

Figure 4E:
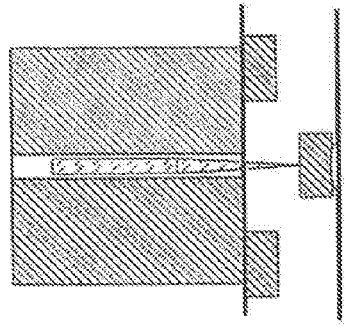
Figure 4F:
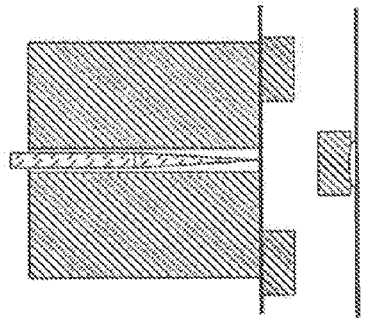

The cap 10 is then moved into the first position. In FIG. 4e, the cap 10 is shown after it has reached the first position. While the cap 10 is being moved into the first position, the tip of the slide 12 remains in contact with the surface of the electronic component 70a to be transferred. Once the cap 10 has reached the first position, the gripping device 20 is deactivated. The slide 12 remains extended so that the slide 12 continues to press the electronic component 70a to be transferred onto the second carrier 74.

Finally, the slide 12 is lifted off the electronic component 70a to be transferred and is retracted. The slide 12 is withdrawn by the first carrier 60. This is shown in FIG. 6f. Once the slide 12 has been received fully in the slide channel 14, a further electronic component can be transferred by the device. That is to say, the method described in connection with FIGS. 4a to 4f can be carried out again.

Although the above-described details of the method and of the device have been described in combination, it should be noted that they are independent of one another and can also be freely combined with one another, at least insofar as individual claims directed thereto are drawn up. The proportions and dimensions shown in the figures have been chosen to make clear important properties and features of the device/method; these proportions and dimensions can be chosen differently in a device that is put into practice.

The invention claimed is:

1. A device for transferring electronic components from a first carrier to a second, strip-shaped carrier comprising:
   at least one slide connected to at least one slide-actuator;
   a cap including a support, a slide channel for receiving the at least one slide, and a gripping device for the first carrier;
   a first receiver configured to position the first carrier on the support, wherein the electronic components are provided on a side of the first carrier that is remote from the support;
   a second receiver configured to position the second carrier;
   wherein the first receiver and the second receiver are so arranged relative to one another that a gap separates the first carrier from the second carrier;
   the cap being configured to be moved by a positioning device from a first position into a second position so that the gap between the first carrier and the second carrier becomes smaller, wherein the positioning device is configured to position the cap and the at least one slide relative to the first receiver and the second receiver;
   the at least one slide being configured to be extended by the at least one slide-actuator relative to the support, to lift the first carrier, which is resting against the support, off the support, and to move an electronic component provided on the first carrier in the direction towards the second carrier; and
   the gripping device is configured to convey the first carrier to the support in order to separate the electronic component from the first carrier.

2. The device according to claim 1 having a control unit configured to terminate the extension of the at least one slide as soon as the control unit detects that the electronic component is in contact with the second carrier or with an adhesive applied to the second carrier.

3. The device according to claim 2 having at least one sensor element connected to the control unit, said sensor element being configured to detect a power consumed by the at least one slide-actuator and/or a distance covered by the at least one slide.

4. The device according to claim 1, wherein the gripping device is connected to a vacuum source.

5. The device according to claim 1, wherein an illuminating device and a camera device are fastened to the positioning device.

6. The device according to claim 1, wherein a heating element is provided in the positioning device.

7. The device according to claim 1, wherein the positioning device further comprises a cap-positioning actuator that displaces the positioning device and the cap in a horizontal direction.

8. The device according to claim 7, wherein the positioning device further comprises a cap-displacing actuator that displaces the positioning device and the cap in a vertical direction, wherein the cap-displacing actuator is used for approximate positioning of the positioning device and the cap, and the cap-positioning actuator is used for fine positioning of the positioning device and the cap.

9. A method for transferring an electronic component from a first carrier to a second, strip-shaped carrier, comprising the steps:
   positioning a cap including a support, a first carrier and a second carrier relative to one another so that at least one slide is provided in a slide channel of the cap, an electronic component provided on the first carrier, and a contact face provided on the second carrier are oriented along a common axis;
   moving the cap and an attached positioning device in a vertical direction and a horizontal direction from a first position into a second position in order to make a gap between the first carrier and the second carrier smaller;
   extending the at least one slide relative to the support of the cap and in the direction towards the second carrier so that the first carrier, which is resting against the support, is lifted off the support; and
   separating the electronic component from the first carrier, which is effected by a gripping device provided in the cap conveying the first carrier to the support.

10. The method according to claim 9, wherein the at least one slide is extended relative to the support and in the direction towards the second carrier until the electronic component provided on the first carrier is in contact with the second carrier or with an adhesive applied to the second carrier.

11. The method according to claim 9, wherein, after the electronic component has been separated from the first carrier, the cap is moved from the second position into the first position.

12. The method according to claim 11, wherein, during the movement of the cap into the first position, the at least one slide is in contact with the electronic component transferred to the second carrier.

13. The method according to claim 11, wherein the at least one slide is retracted once the cap has reached the first position.

14. The method according to claim 9, wherein the gripping device conveys the first carrier to the support by means of a vacuum.

15. The method according to claim 14, wherein the first carrier is first drawn in at the outside edge of the support.

16. The method according to claim 9, wherein, in order to control the movement of the at least one slide, the power consumed by a slide-actuator is detected and/or a distance covered by the at least one slide is detected.

17. The method according to claim 16, wherein the extension of the at least one slide is terminated when the power consumed by the slide-actuator and/or the distance covered by the at least one slide exceeds a threshold value.

* * * * *